United States Patent [19]
Dolhert et al.

[11] Patent Number: 5,200,249
[45] Date of Patent: Apr. 6, 1993

[54] VIA METALLIZATION FOR ALN CERAMIC ELECTRONIC PACKAGE

[75] Inventors: Leonard E. Dolhert, Clarksville; Jack H. Enloe, Columbia; Ellice Y. Luh, Bethesda; John W. Lau, Gaithersburg, all of Md.

[73] Assignee: W. R. Grace & Co.-Conn., New York, N.Y.

[21] Appl. No.: 748,487

[22] Filed: Aug. 22, 1991

Related U.S. Application Data

[63] Continuation-in-part of Ser. No. 567,518, Aug. 15, 1990.

[51] Int. Cl.$^5$ ............................................... B32B 3/00
[52] U.S. Cl. ..................................... 428/137; 428/209; 428/210; 428/901; 264/65; 501/96; 501/97
[58] Field of Search ............... 428/137, 209, 210, 901; 264/65; 501/96, 97

[56] References Cited

U.S. PATENT DOCUMENTS

| | | | |
|---|---|---|---|
| 4,770,953 | 9/1988 | Horiguchi et al. | 428/698 |
| 4,800,137 | 1/1989 | Okuno et al. | 428/698 |
| 4,818,626 | 4/1989 | Werdecker et al. | 428/469 |
| 4,883,704 | 11/1989 | Sato et al. | 428/209 |
| 4,894,273 | 1/1990 | Lieberman et al. | 428/137 |
| 4,965,659 | 10/1990 | Sasame et al. | 357/81 |

*Primary Examiner*—Patrick J. Ryan
*Assistant Examiner*—Cathy K. Lee
*Attorney, Agent, or Firm*—Steven Capella

[57] ABSTRACT

Metallization formulations containing a mixture of AlN and metal are used to form hermetic vias in AlN dielectric bases for electronic packaging. The metal may be W, Mo, or mixtures thereof. The metallization may be cofired with the AlN dielectric base. The metallization is especially useful for making electrically conductive hermetic through-vias in AlN bases.

9 Claims, No Drawings

VIA METALLIZATION FOR ALN CERAMIC ELECTRONIC PACKAGE

This application is a continuation-in-part of U.S. patent application Ser. No. 567,518, filed Aug. 15, 1990, now pending.

FIELD OF THE INVENTION

This invention relates to metallization formulations for use in vias of aluminum nitride bases for electronic packaging. The invention is particularly applicable for the formation of hermetic through-vias.

BACKGROUND OF THE INVENTION

Integrated circuits (chips) are very small, highly concentrated groups of electronic circuitry. Because of their small size and vulnerability to external environments, it is generally necessary to place the chips in an electronic package which allows the chips to perform their function while being protected from damage.

Dielectric ceramic bases are often used as foundations in electronic packages. The chip(s) or an intermediate substrate containing the chip(s) would be mounted on the dielectric base. Dielectric ceramic bases typically contain conductive metallization patterns. The metallization patterns may comprise thin conductor lines travelling across the interior of the dielectric base, at least roughly parallel with the chip(s).

The metallization may also include conductive vias. Vias run partially or completely through the thickness of the dielectric base, roughly perpendicular to the chip(s). Vias are generally larger in cross section than conductor lines. Vias can be used to provide contact between different levels of conductor lines in the base, etc.

Dielectric ceramic bases are typically formed by laminating a series of green ceramic layers together and firing the laminate to produce a dense ceramic. The green ceramic layers are typically formed from tapes which contain a mixture of ceramic particles and a binder. Conductor lines are formed by placing a metallization pattern on one or more of the green ceramic layers prior to firing. This is often done by screening a metal paste or ink onto the green ceramic tape.

Among other methods, vias may be formed by punching holes in the green ceramic tape and filling the holes with metal paste. The metallized green ceramic layers are then laminated in alignment so the metal-containing holes of each layer are lined up with the appropriate holes of the other layers to form the desired vias. Vias may be constructed to partially or completely traverse the thickness of the dielectric ceramic base.

In many instances, it is desirable that the electronic package be completely and reliably hermetic such that virtually all foreign materials (including gases and liquids) are prevented from contacting the chip(s). To achieve complete and reliable hermeticity, it is generally necessary to prevent leakage into the chip area along all possible paths. One possible path of leakage is along any "through-vias" or other interconnected metallization that communicates between the chip area and the external surface of the package. Through-vias are vias which traverse the entire thickness of the dielectric base providing electrical contact at both the upper and lower surfaces.

In conventional ceramic-based electronic packaging, alumina or glass ceramics were used as the dielectric ceramic materials. For those systems, hermeticity has been relatively easy to obtain because glass phases associated with those systems flow to alleviate porosity or discontinuities along through-via paths.

Recently, electronic packages based on aluminum nitride have been developed. Examples of such packages are disclosed in U.S. Pat. No. 4,920,640. The aluminum nitride system is much more refractory than the conventional ceramic systems. Additionally, the AlN system typically contains comparatively little or no glass phase which might assist in achieving hermetic through-vias. Accordingly, there is a need for via metallization capable of achieving hermeticity in aluminum nitride based electronic packages.

SUMMARY OF THE INVENTION

The invention provides metallization formulations capable of achieving hermetic vias in aluminum nitride dielectric bases. The invention further encompasses aluminum nitride bases, for use in electronic packages, containing hermetic vias as well as methods of making such dielectric bases.

In one aspect, the invention encompasses a refractory metallization composition comprising aluminum nitride particles and metal particles selected from the group consisting of tungsten, molybdenum and mixtures thereof. The metallization, in paste form, preferably contains a "vehicle" comprising a binder, a dispersant and a solvent. The binder and dispersant are preferably "clean burning" in reducing atmospheres.

In another aspect, the invention encompasses an aluminum nitride base for use in an electronic package, the base containing at least one electrically conductive via where the via comprises aluminum nitride and metal selected from the group consisting of tungsten, molybdenum, and mixtures thereof. The via is preferably hermetic. In one preferred embodiment, the via is a hermetic through-via. Preferably, the base contains a plurality of such through-vias.

The invention also encompasses a method of making a hermetic electrically conductive via in an aluminum nitride ceramic base. The method comprises:
a) combining aluminum nitride powder and metal powder selected from the group consisting of tungsten, molybdenum, and mixtures thereof, with a binder, a solvent, and a dispersant to form a metallization paste;
b) forming a via hole in each of a plurality of green aluminum nitride tapes;
c) filling the holes with the paste;
d) laminating the tapes such that the holes are in alignment above each other; and
e) firing the laminate to densify the aluminum nitride tapes and the metallization.

The firing step preferably comprises hot pressing the laminate.

DETAILED DESCRIPTION OF THE INVENTION

The via metallization formulation of the invention contains a mixture of aluminum nitride and metal, the metal being selected from the group consisting of tungsten, molybdenum, and mixtures thereof. The via metallization paste formulation further preferably contains a "vehicle" comprising a binder, a dispersant, and a solvent. Preferably, the vehicle is substantially or completely removed from the metallization before or during densification of the metallization.

The aluminum nitride component of the metallization improves the overall property match between the metallization and the aluminum nitride ceramic base. Particularly, the aluminum nitride component lessens differences, if any, in thermal expansion between the metallization and the ceramic base. If such differences are too great, excessive stress may build up along the via during cooling. The stress may cause cracking which may result in a loss of hermeticity. Additionally, the aluminum nitride generally improves the adherence of the via metallization to the ceramic base.

The maximum amount of aluminum nitride is dependent on the desired electrical conductivity of the via. As the amount of aluminum nitride is increased, the minimum cross sectional area of continuous metal phase in the via decreases, thereby decreasing the overall electrical conductance. Since the via geometry also affects the electrical conductance of the via, the upper limit on the aluminum nitride content may vary depending on the via geometry.

Preferably, the metallization comprises about 5-75 vol. % aluminum nitride based on the total of AlN, W, and Mo, more preferably about 25-60 vol. %.

The relative proportions of tungsten and molybdenum may be varied widely, ranging from all tungsten to all molybdenum. Preferably, the metallization contains both tungsten and molybdenum. More preferably, the metallization contains about 20-70 vol. % tungsten and about 5-25 vol. % molybdenum based on the total of AlN, W, and Mo. Preferably, the volume ratio of W:Mo is about 2-4, more preferably about 3.

The vehicle may be any compatible formulation. Preferably, the vehicle comprises a binder, a dispersant, and a solvent. The vehicle may contain any other conventional expedients associated with ink or paste vehicles.

The binder may be any conventional binder. Preferably, the binder is clean-burning under the reducing atmosphere conditions generally used to densify aluminum nitride ceramic bases. Preferred binders are ethyl cellulose and polymethacrylates. Mixtures of binders may also be used.

The dispersant may be any conventional dispersant or combination of dispersants. Preferably, the dispersant is also clean-burning under reducing conditions. A proprietary dispersant sold under the name Troykyd ® 98-C by Troy Chemical Corp. is a preferred dispersant.

The solvent may be any compatible solvent. α—terpineol is a preferred solvent. The proportions of the vehicle constituents are not critical, however, they should be selected to produce a paste of suitable consistency for via-filling and lamination steps typically used in forming the ceramic base.

The relative proportions of vehicle and metallization can be varied. A higher proportion of vehicle may result in a lower density, lower electrical conductance via. Generally, the amount of vehicle is preferably about 5-15 wt. % of the total paste formulation.

While the vehicle and metallization compositions have been discussed with respect to the specific components recited, any other compatible ingredients may also be included in the metallization or vehicle.

Any conventional method can be used to construct the hermetic vias of the invention. Typically, the vias are constructed as part of a dielectric ceramic base for use in an electronic package. One method for making dielectric ceramic bases containing vias is disclosed in U.S. Pat. No. 4,920,640 which disclosure is incorporated herein by reference.

A preferred method for forming a dense aluminum nitride base containing at least one hermetic, electrically conductive via includes the following steps:
a) combining aluminum nitride powder and metal powder selected from the group consisting of tungsten, molybdenum, and mixtures thereof, with a binder, a solvent, and a dispersant to form a metallization paste;
b) forming a via hole in each of a plurality of green aluminum nitride tapes;
c) filling the holes with the paste;
d) laminating the tapes such that the holes are in alignment above each other; and
e) firing the laminate to densify the aluminum nitride tapes and the metallization to obtain a dense aluminum nitride base with a hermetic via.

The components of step a) can be combined using any known technique. Preferably, the aluminum nitride and metal powders are first milled together, then combined with the other ingredients, followed by additional ball milling.

The green aluminum nitride tapes may be obtained by any known method; an extrusion method is described in U.S. Pat. No. 4,920,640. The via holes may be formed using any known method such as numerical punching, laser machining, etc. Typically, several via holes would be formed in each tape in order to create several vias in dielectric base.

The via holes may be filled with the metallization paste by drawing the metallization paste into the hole by a means of a vacuum applied at an opening of the hole. Any other known method may alternatively be used.

The filled tapes are then laminated in registration such that the respective via holes are aligned above each other. The lamination procedure disclosed in U.S. Pat. No. 4,920,640 or any other suitable procedure may be used.

The laminate is then fired to densify the metallization and the green aluminum nitride tapes. The densification results in a monolithic, hermetic base suitable for use in an electronic package. Preferably, the firing comprises hot pressing the laminate as described in U.S. Pat. No. 4,920,640 and U.S. patent application Ser. No. 631,577, filed Dec. 21, 1990, which disclosure is incorporated by reference.

The invention is further illustrated by the following example. The invention is not limited to the particular steps, ingredients or results recited in the example.

EXAMPLE

Via metallization paste was formed as follows:
a) 41.25 vol. % W powder, 13.75 vol. % Mo powder and 45.00 vol. % AlN powder were ball-milled together,
b) the powder mixture was combined with the vehicle constituents in the following proportions:
   87.7 wt. % W/Mo/AlN mixture
   0.9 wt. % polymethacrylate resin
   10.5 wt. % α-terpineol solvent
   0.9 wt. % Troykyd ® 98-C dispersant, and
c) the mixture was further milled to produce a homogeneous paste.

Ten layers of 28 mil thick green AlN tape were extruded in the manner described in U.S. Pat. No. 4,920,640. A group of 10 mil diameter vias were punched into each layer using a numerical punch. The metallization paste was pressed into the via holes using a squeegee while a vacuum was applied on the other side of the layer to further draw the paste into the via holes. The layers were then stacked with the via holes in registration. The laminate was then hot pressed in a 3% $H_2$/97% $N_2$ atmosphere at 1850° C. to produce a dense dielectric base.

The top and bottom surfaces of the base were subjected to grinding. The resistivity of the vias was measured to be about 1 ohm. The hermeticity, as determined by a helium leak test, was about $10^{-9}$ atm $cm^3$/sec over a circular area 1.6" in diameter which contained at least 100 through-vias.

What is claimed is:

1. A dielectric aluminum nitride base for use in an electronic package, said base comprising dense aluminum nitride ceramic and at least one electrically conductive, hermetic via, said via consisting of metallization, said metallization consisting essentially of:
   a) aluminum nitride, and
   b) metal selected from the group consisting of tungsten, molybdenum and mixtures thereof.

2. The base of claim 1 wherein said via is a through-via which traverses the entire thickness of said ceramic base.

3. The base of claim 2 comprising a plurality of said through-vias.

4. The base of claim 2 wherein said metallization consists of AlN, W, and Mo.

5. The base of claim 3 wherein said metallization consists of AlN, W, and Mo.

6. The base of claim 4 wherein said metallization consists of about:
   20–70 vol. % W,
   5–25 vol. % Mo, and
   5–75 vol. % AlN.

7. The base of claim 6 wherein said metallization contains about 25–60 vol. % AlN.

8. The base of claim 7 wherein W and Mo are present in the metallization at a volume ratio of W:Mo of about 2–4.

9. The base of claim 8 wherein said volume ratio is about 3.

* * * * *